United States Patent
Zhong et al.

(10) Patent No.: US 11,994,778 B2
(45) Date of Patent: May 28, 2024

(54) COLOR FILTER SUBSTRATE AND DISPLAY PANEL

(71) Applicant: WUHAN CHINA STAR OPTOELECTRONICS TECHNOLOGY CO., LTD, Wuhan (CN)

(72) Inventors: Li Zhong, Wuhan (CN); Guowei Zha, Wuhan (CN)

(*) Notice: Subject to any disclaimer, the term of this patent is extended or adjusted under 35 U.S.C. 154(b) by 813 days.

(21) Appl. No.: 16/969,562

(22) PCT Filed: Jun. 23, 2020

(86) PCT No.: PCT/CN2020/097618
§ 371 (c)(1),
(2) Date: Aug. 13, 2020

(87) PCT Pub. No.: WO2021/243766
PCT Pub. Date: Dec. 9, 2021

(65) Prior Publication Data
US 2023/0099140 A1    Mar. 30, 2023

(30) Foreign Application Priority Data
Jun. 1, 2020 (CN) .......................... 202010485380.8

(51) Int. Cl.
G02F 1/1362 (2006.01)
H01L 25/075 (2006.01)
H01L 33/54 (2010.01)

(52) U.S. Cl.
CPC .. *G02F 1/136222* (2021.01); *G02F 1/136286* (2013.01); *H01L 25/0753* (2013.01); *H01L 33/54* (2013.01)

(58) Field of Classification Search
CPC ......... G02F 1/136222; G02F 1/136286; G02F 1/133509; G02F 1/1333; G02F 1/133514;
(Continued)

(56) References Cited

U.S. PATENT DOCUMENTS

2019/0137814 A1* 5/2019 Huang .............. G02F 1/133512
2020/0096685 A1* 3/2020 Ma .................... G02F 1/136209
(Continued)

FOREIGN PATENT DOCUMENTS

CN    108732816 A    11/2018
CN    110231735 A    9/2019
(Continued)

OTHER PUBLICATIONS

Zha, CN110275340A, machine translation 2019 (Year: 2019).*
(Continued)

*Primary Examiner* — Tracie Y Green (57) ABSTRACT

A color filter substrate and a display panel including the same are provided. The color filter substrate includes a first pixel area and a second pixel area adjacent to the first pixel area, and further includes: a plurality of micro light-emitting diode (LED) units disposed on a first surface of the base substrate in the first pixel area, wherein there are a plurality of light-transmitting areas among the micro LED units; and a color resist disposed on a second surface of the base substrate in the second pixel area, wherein the first surface and the second surface are two opposite surfaces of the base substrate.

19 Claims, 8 Drawing Sheets

(58) Field of Classification Search
CPC ........... G02F 1/133357; H01L 25/0753; H01L 33/54; G09F 9/33; G09G 3/32
See application file for complete search history.

(56) References Cited

U.S. PATENT DOCUMENTS

| | | | |
|---|---|---|---|
| 2021/0173243 A1* | 6/2021 | Chen | G02F 1/133357 |
| 2021/0271009 A1* | 9/2021 | Wang | G02F 1/133553 |
| 2021/0288231 A1* | 9/2021 | Li | H01L 33/58 |
| 2022/0028845 A1* | 1/2022 | Yu | H01L 33/48 |
| 2022/0121059 A1* | 4/2022 | Luo | G02F 1/133514 |
| 2023/0100095 A1* | 3/2023 | Zou | G02F 1/133512 349/56 |
| 2023/0236453 A1* | 7/2023 | Zha | G02F 1/1333 349/42 |

FOREIGN PATENT DOCUMENTS

| | | | | |
|---|---|---|---|---|
| CN | 110275340 A | * | 9/2019 | G02F 1/1333 |
| CN | 110275340 A | | 9/2019 | |
| CN | 110632789 A | | 12/2019 | |
| CN | 110794604 A | | 2/2020 | |
| WO | WO-2021258489 A1 | * | 12/2021 | G02F 1/1333 |

OTHER PUBLICATIONS

International Search Report in International application No. PCT/CN2020/097618, dated Feb. 20, 2021.
Written Opinion of the International Search Authority in International application No. PCT/CN2020/097618, dated Feb. 20, 2021.

* cited by examiner

| A first driving circuit and a plurality of first welding electrodes electrically connected to the first driving circuit are formed on a first surface of a base substrate in a first pixel area. The first driving circuit comprises a plurality of scan lines extending in a transverse direction and a plurality of data lines extending in a longitudinal direction. The first welding electrodes are located in a sub-pixel region defined by two adjacent scan lines and two adjacent data lines. | S1 |

| A plurality of micro LED units are transferred to the base substrate in the first pixel area, and a plurality of second welding electrodes of the micro LED units are electrically bonded to the first welding electrodes. | S2 |

| An encapsulation layer is formed on the micro LED units and the base substrate. | S3 |

| A plurality of color resists are formed on a second surface of the base substrate. The color resists are formed in a second pixel area adjacent to the first pixel area. | S4 |

COLOR FILTER SUBSTRATE AND DISPLAY PANEL

FIELD OF INVENTION

The present disclosure relates to the technical field of display, and particularly to a color filter substrate and a display panel.

BACKGROUND

With popularity of full screens and consumers' pursuit of integration, under-screen sensing technology has become a focus of development in a field of small and medium-sized displays. Because liquid crystal display (LCD) screens are passive light-emitting devices and their entire surfaces require backlights, an optical sensor and an optical display cannot overlap in space. Therefore, development of LCD screens to full screens is restricted.

Organic light-emitting diode (OLED) screens use OLED pixels to emit light actively. Therefore, compared to LCD screens, on one hand, OLED screens have advantages of high contrast, lightness, thinness, bendability, foldability, and the like. On the other hand, OLED screens do not require backlight, so they can be very compatible with current optical sensors. Accordingly, in-plane optical sensing technology has become a unique advantage of current OLED screens. OLED screens can be switched between a display mode and an imaging mode, and does not require a drilling process of current LCD screens. A digging area formed by the digging process cannot display.

Therefore, with increasing pursuit of ultra-full screens, LCD screens with a low-cost advantage appear to be at a disadvantage. How to make LCD screens meet current extreme demand for full screens has become an urgent problem to be solved.

SUMMARY OF DISCLOSURE

The present disclosure provides a color filter substrate and a display panel, which can solve the following problem: an optical sensor and an optical display in a current liquid crystal display (LCD) screen cannot overlap in space, so that the LCD screen cannot meet people's extreme demand for full screens.

In order to solve the above problem, the present disclosure provides the following technical solutions.

The present disclosure provides a color filter substrate comprising a first pixel area and a second pixel area adjacent to the first pixel area, and further comprising:
  a base substrate;
  a plurality of micro light-emitting diode (LED) units disposed on a first surface of the base substrate in the first pixel area, wherein there are a plurality of light-transmitting areas among the micro LED units; and
  a color resist disposed on a second surface of the base substrate in the second pixel area, wherein the first surface and the second surface are two opposite surfaces of the base substrate.

In an embodiment, the color filter substrate further comprises an encapsulation layer covering the first surface, the micro LED units, and the light-transmitting areas.

In an embodiment, a distance between a surface of the encapsulation layer away from the base substrate and the base substrate is greater than a distance between surfaces of the micro LED units away from the base substrate and the base substrate.

In an embodiment, a thickness of parts of the encapsulation layer corresponding to the micro LED units is 2 μm to 80 μm, and a thickness of other parts of the encapsulation layer is 3 μm to 100 μm.

In an embodiment, a light transmittance of the encapsulation layer is greater than or equal to 70%.

In an embodiment, the color filter substrate further comprises a first driving circuit disposed on the first surface, and the micro LED units are disposed on and electrically connected to the first driving circuit.

In an embodiment, the first driving circuit comprises a plurality of scan lines extending in a transverse direction and a plurality of data lines extending in a longitudinal direction, two adjacent scan lines and two adjacent data lines define a sub-pixel region, and an area of an orthographic projection of each of the micro LED units on the base substrate is less than an area of an orthographic projection of each of the sub-pixel regions on the base substrate.

In an embodiment, the area of the orthographic projection of each of the micro LED units on the base substrate accounts for 10%-50% of the area of the orthographic projection of each of the sub-pixel regions on the base substrate, and the micro LED units comprise a red light-emitting unit, a green light-emitting unit, and a blue light-emitting unit.

In an embodiment, the color filter substrate further comprises a flat layer covering the second surface and a surface of the color resist away from the base substrate, and a surface of the flat layer away from the base substrate is a flat surface.

The present disclosure further provides a display panel comprising the aforementioned color filter substrate.

In order to solve the above problem, the present disclosure further provides a color filter substrate comprising a first pixel area and a second pixel area adjacent to the first pixel area, and further comprising:
  a base substrate;
  a plurality of micro light-emitting diode (LED) units disposed on a first surface of the base substrate in the first pixel area, wherein there are a plurality of light-transmitting areas among the micro LED units; and
  a color resist disposed on a second surface of the base substrate in the second pixel area, wherein the first surface and the second surface are two opposite surfaces of the base substrate;
  wherein the first pixel area is a micro LED display area, and the second pixel area is a liquid crystal display area.

In an embodiment, the color filter substrate further comprises an encapsulation layer covering the first surface, the micro LED units, and the light-transmitting areas.

In an embodiment, a distance between a surface of the encapsulation layer away from the base substrate and the base substrate is greater than a distance between surfaces of the micro LED units away from the base substrate and the base substrate.

In an embodiment, a thickness of parts of the encapsulation layer corresponding to the micro LED units is 2 μm to 80 μm, and a thickness of other parts of the encapsulation layer is 3 μm to 100 μm.

In an embodiment, a light transmittance of the encapsulation layer is greater than or equal to 70%.

In an embodiment, the color filter substrate further comprises a first driving circuit disposed on the first surface, and the micro LED units are disposed on and electrically connected to the first driving circuit.

In an embodiment, the first driving circuit comprises a plurality of scan lines extending in a transverse direction and a plurality of data lines extending in a longitudinal direction, two adjacent scan lines and two adjacent data lines define a sub-pixel region, and an area of an orthographic projection of each of the micro LED units on the base substrate is less than an area of an orthographic projection of each of the sub-pixel regions on the base substrate.

In an embodiment, the area of the orthographic projection of each of the micro LED units on the base substrate accounts for 10%-50% of the area of the orthographic projection of each of the sub-pixel regions on the base substrate, and the micro LED units comprise a red light-emitting unit, a green light-emitting unit, and a blue light-emitting unit.

In an embodiment, the color filter substrate further comprises a flat layer covering the second surface and a surface of the color resist away from the base substrate, and a surface of the flat layer away from the base substrate is a flat surface.

A color filter substrate and a display panel comprising the same provided by the present disclosure achieve ultra-full screen LCD display by combining micro light-emitting diode (micro LED) display technology and liquid crystal display (LCD) display technology, and achieve an in-screen integrated sensor function by taking full advantage of small sizes of micro LED units to improve transparency of the panel. The present invention achieves seamless connection between the micro LED display technology and the LCD display technology in horizontal and vertical spaces of a display, thereby solving the following problem: an optical sensor and an optical display in a current LCD screen cannot overlap in space, so that the LCD screen cannot meet people's extreme demand for full screens.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within the claimed scope of the present disclosure.

In the description of the present disclosure, it should be understood that location or position relationships indicated by terms, such as "longitudinal", "transverse", "length", "width", "up", "down", "front", "rear", "left", "right", "vertical", and "horizontal" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited. In the present disclosure, "/" means "or".

Reference numerals and/or letters may be repeated in different examples of the present disclosure. Such repetitions are for simplicity and clarity, which per se do not indicate relations among the discussed embodiments and/or settings.

In the field of small and medium-sized displays, full-screen technology has become a current focus of research and development. Currently, mainstream display technologies comprise liquid crystal displays (LCDs) and organic light-emitting diodes (OLEDs). LCDs belong to passive light-emitting technology. An LCD illuminates a liquid crystal cell by a backlight structure disposed on its entire surface, thereby controlling brightness and darkness of optical fibers. OLED technology uses OLED pixels to emit light actively. Compared to LCDs, OLED screens have advantages of high contrast, lightness, thinness, bendability, foldability, and the like, and can be very compatible with current optical fingerprint recognition module and the like. Therefore, in-plane optical sensing technology has become a unique advantage of current OLED screens. LCD screens with a low-cost advantage appear to be at a disadvantage.

Accordingly, the primary purpose of the present disclosure is to provide a color filter substrate and a manufacturing method thereof, a display panel, and a display device to solve the following problem: an optical sensor and an optical display in a current LCD screen cannot overlap in space, so that the LCD screen cannot meet people's extreme demand for full screens.

In addition, similar to OLED technology, micro light-emitting diodes (micro LEDs) have a characteristic of active light emission. Furthermore, inorganic LEDs have characteristics of high stability, high efficiency, and the like. Therefore, compared with OLEDs, micro LEDs have advantages of long service life, high brightness, small sizes of the control chip, long response time, and the like. However, compared with traditional panels that are manufactured by "subtractive" methods such as etching, micro LEDs are mainly manufactured by an "additive" method, i.e. mass-transfer. Mass-transfer has a lower technological maturity, and has inherent problems of process yield and cost challenges, particularly when display pixels are mass-transferred.

Accordingly, another purpose of the present disclosure is to provide a color filter substrate and a manufacturing method thereof, a display panel, and a display device to solve the following problem: when micro LEDs are applied in display technology, mass-transfer results in low process yield and high cost, which limits application of micro LEDs in display technology.

A color filter substrate and a manufacturing method thereof, a display panel, and a display device of the present application will be described in detail below in conjunction with specific embodiments.

Please refer to FIG. 1(a) to FIG. 1(e), which are top views of different types of color filter substrates according to embodiments of the present disclosure. A color filter substrate of the present disclosure comprises a first pixel area 100 and a second pixel area 200 adjacent to the first pixel area 100. The first pixel area 100 is a micro LED display area, and the second pixel area 200 is a liquid crystal display area. The first pixel area 100 and the second pixel area 200 are seamlessly connected, so there is no display interruption or discontinuous border visually. Therefore, a complete full-screen design can be achieved. Furthermore, because micro LEDs have characteristics of high brightness and long service life, some of micro LED units in the first pixel area 100 can be used as a supplementary light, an indicator light, and the like.

Please refer to FIG. 1(a) to FIG. 1(e) and FIG. 2, the color filter substrate of the present disclosure further comprises: a base substrate 10 located in the first pixel area 100 and the second pixel area 200; a plurality of micro LED units 30 disposed on a first surface 10a of the base substrate 10 in the first pixel area 100, wherein there are a plurality of light-transmitting areas among the micro LED units 30; and a plurality of color resists 50 disposed on a second surface 10b of the base substrate 10 in the second pixel area 200, wherein the first surface 10a and the second surface 10b are two opposite surfaces of the base substrate 10.

The color filter substrate of the present disclosure combines micro light-emitting diode display technology and liquid crystal display technology, thereby realizing ultra-full screen LCD display. Furthermore, the color filter substrate is provided with a light-transmitting area between any two adjacent micro LED units 30. The light-transmitting areas can allow light to pass through. Therefore, an in-screen sensor integration solution can be implemented in the first pixel area 100. In addition, the present invention integrates the micro LED units 30 on one surface of the color filter substrate (on-cell), thereby avoiding an additional process of combining a liquid crystal panel and a micro LED display glass required by an out-cell micro LED display glass, and solving the problem of image floating caused by the out-cell micro LED display glass. The present invention integrates a micro LED display on a panel.

Please refer to FIG. 2, a color filter substrate according to an embodiment of the present disclosure will be described in detail below. The color filter substrate comprises: a base substrate 10, which may be a glass substrate or a flexible substrate with a high light transmittance; a first driving circuit 20 disposed on a first surface 10a of the base substrate 10 in a first pixel area 100; a plurality of micro LED units 30 disposed on and electrically connected to the first driving circuit 20, wherein the first driving circuit 20 is configured to provide a driving signal to the micro LED units 30 to make the micro LED units 30 emit light; an encapsulation layer 40 covering the micro LED units 30 and the base substrate 10 and configured to encapsulate the micro LED units 30; a plurality of color resists 50 disposed on a second surface 10b of the base substrate 10 in the second pixel area 200; and a plurality of black matrixes 60 disposed between any two adjacent color resists 50, wherein the color resists 50 and the black matrixes 60 are not disposed in the first pixel area 100.

The first driving circuit 20 comprises a plurality of scan lines (not shown) extending in a transverse direction and a plurality of data lines (not shown) extending in a longitudinal direction. Two adjacent scan lines and two adjacent data lines define a sub-pixel region. The scan lines and the data lines may also extend into the second pixel area 200. It can be understood that in order not to affect display of pixels in the second pixel area 200, portions of the scan lines and the data lines extending in the second pixel area 200 are not disposed corresponding to positions of the color resists 50, that is, may be disposed corresponding to positions of the black matrixes 60.

In an embodiment, the first driving circuit 20 may adopt active-matrix (AM) driving technology. That is, the first driving circuit 20 further comprises thin film transistors (not shown). Each of the micro LED units 30 is electrically connected to a corresponding scan line and a corresponding data line through a corresponding thin film transistor.

In this embodiment, in order to preferentially ensure a transmittance of the first pixel region 100, the first driving circuit 20 adopts a passive-matrix (PM) driving technology. That is, the first driving circuit 20 is not provided with thin film transistors.

In this embodiment, the micro LED units 30 display three colors. That is, the micro LED units 30 comprise red light-emitting units, green light-emitting units, and blue light-emitting units. The micro LED units 30 have a size of 1 μm-100 μm. The micro LED units 30 have a height of 1 μm-20 μm. The micro LED units 30 may be a substrate surface emitting structure or an electrode surface emitting structure, which is not limited herein.

In another embodiment, the micro LED units 30 adopt a technical solution of combining a blue light display and color conversion layers. That is, each of the red light-emitting units comprises a blue light-emitting unit and a color conversion layer disposed on the blue light-emitting unit, and the color conversion layer can convert blue light emitted by the blue light-emitting unit into red light. Each of the green light-emitting units comprises a blue light-emitting unit and a color conversion layer disposed on the blue light-emitting unit, and the color conversion layer can convert blue light emitted by the blue light-emitting unit into green light. The color conversion layers are quantum dot films, phosphor powder, or the like, which are not specifically limited herein.

Figure 3:
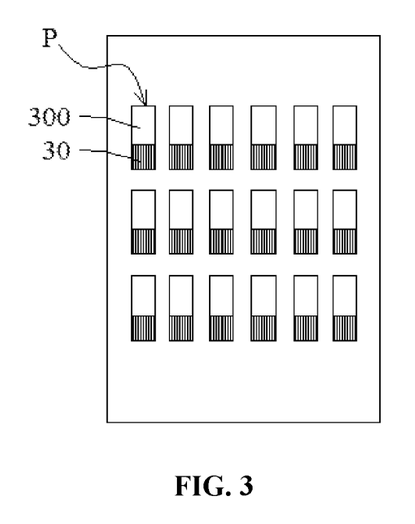
FIG. 3 is a schematic diagram of a color filter substrate provided with micro light-emitting diode (LED) units according to an embodiment of the present disclosure.

Please refer to FIG. 3, which is a schematic diagram of a color filter substrate provided with micro light-emitting diode (LED) units according to an embodiment of the present disclosure. The micro LED units 30 have an advantage of small size. Therefore, an area of an orthographic projection of each of the micro LED units 30 on the base substrate 10 is less than an area of an orthographic projection of each of sub-pixel regions P on the base substrate 10, so that there are a plurality of light-transmitting areas 300 among the micro LED units 30.

Furthermore, the area of the orthographic projection of each of the micro LED units 30 on the base substrate 10 accounts for 10%-50% of the area of the orthographic projection of each of the sub-pixel regions P on the base substrate 10.

In a condition that the first pixel area 100 can display normally, because a coverage area of each of the micro LED units 30 is less than an area of each of the sub-pixel regions P, light can pass normally through an area not covered by the micro LED units 30 in each of the sub-pixel regions P. By turning off the micro LED units 30, an external image collected by the first pixel area 100 can enter into an under-screen sensor. In this way, various under-screen sensing solutions such as under-screen fingerprint recognition, under-screen camera, under-screen face recognition, and under-screen distance sensing can be realized.

Figure 1A:
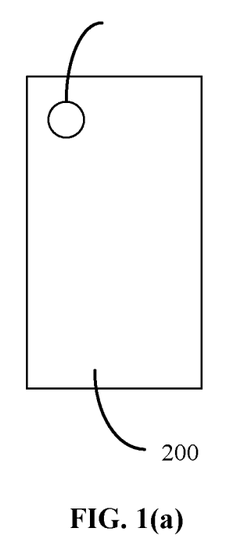
FIG. 1(a) to FIG. 1(e) are top views of different types of color filter substrates according to embodiments of the present disclosure.
Figure 1B:
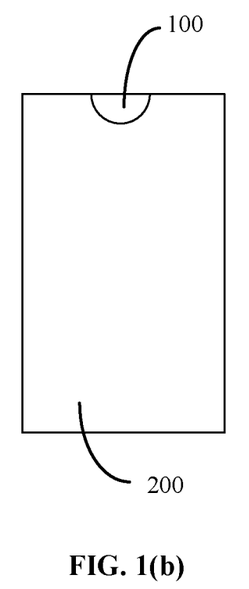
Figure 1C:
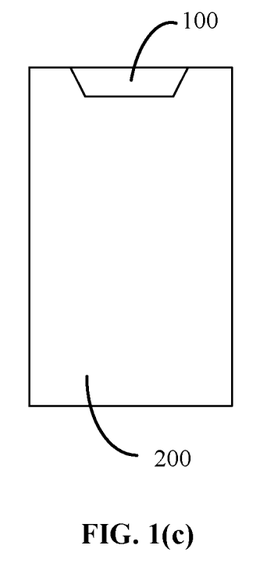
Figure 1D:
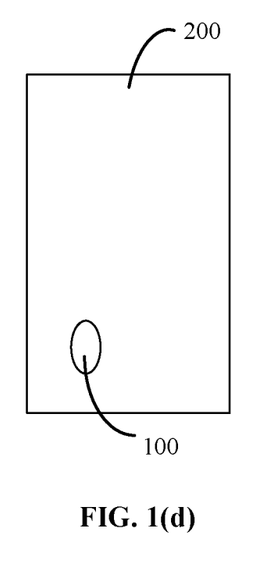
Figure 1E:
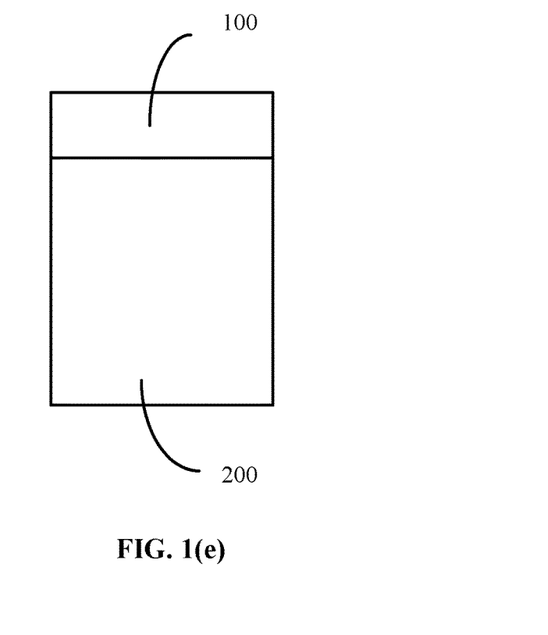
Figure 2:
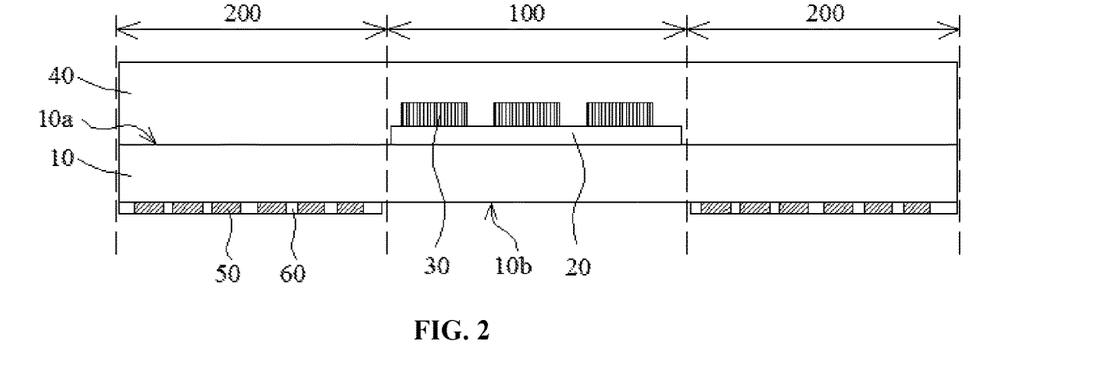
FIG. 2 is a schematic cross-sectional view of a color filter substrate according to an embodiment of the present disclosure.

Please refer to FIG. 2, the encapsulation layer 40 is located in the first pixel area 100 and the second pixel area 200. The encapsulation layer 40 may be a stack of inorganic layers and organic layers, and is not limited thereto. A material of the encapsulation layer 40 has good high temperature resistance and good light transmittance. On one hand, the encapsulation layer 40 is configured to protect and encapsulate the micro LED units 30 and the first driving circuit 20 to prevent external moisture and the like from entering the color filter substrate and causing damage to a device. On the other hand, the encapsulation layer 40 is configured to planarize the first surface 10a of the base substrate 10 on which the micro LED units 30 is formed. The encapsulation layer 40 has a thickness of 3 μm-200 μm and can fill up a level difference formed on the base substrate 10 due to bonding of the micro LED units 30. That is, a distance between a surface of the encapsulation layer 40 away from the base substrate 10 and the base substrate 10 is greater than a distance between surfaces of the micro LED units 30 away from the base substrate 10 and the base substrate 10.

Furthermore, because the micro LED units 30 usually have a height of 1 μm-20 μm, in order to ensure lightness and thinness of the color filter substrate, as well as effects of encapsulation and planarization, the encapsulation layer 40 may has a thickness of 3 μm-100 μm.

A thickness of parts of the encapsulation layer 40 corresponding to the micro LED units 30 is less than a thickness of other parts of the encapsulation layer 40.

The thickness of the parts of the encapsulation layer 40 corresponding to the micro LED units 30 is 2 μm to 80 μm. Therefore, it can be ensured that the encapsulation layer 40 completely covers the micro LED units 30 and has a good encapsulation performance.

A surface of the encapsulation layer 40 away from the base substrate 10 is a flat surface. Therefore, the encapsulation layer 40 also effectively solves the large level difference caused by bonding the micro LED units 30.

In order not to affect a light transmittance of the first pixel area 100, a light transmittance of the encapsulation layer 40 is greater than or equal to 70%.

Furthermore, the light transmittance of the encapsulation layer 40 is greater than or equal to 85%.

In an embodiment, the color filter substrate further comprises a flat layer (not shown) covering the second surface 10b and a surface of the color resists 50 away from the base substrate 10, and a surface of the flat layer away from the base substrate 10 is a flat surface. In this way, the flat layer can planarize the second surface 10b of the base substrate 10 provided with the color resists 50.

In this embodiment, a side of the encapsulation layer 40 away from the base substrate 10 is provided with a protective layer configured to protect the encapsulation layer 40 from damage.

Because the color filter substrate of the present disclosure is provided with the micro LED units 30 only in the first pixel area 100, and the first pixel area 100 has a relatively small area, mass transfer is not required. In this way, application of micro LED display technology to a display panel/display device can be realized, and the problems of low process yield and high cost when display pixels are mass-transferred can also be solved.

When micro LED display technology is applied to a display panel, processes of forming a micro LED driving circuit and bonding micro LED units need to be carried out at high temperature. High temperature will cause certain adverse effects on components on the display panel. In particular, when the micro LED units and their driving circuit are made on a color filter substrate, high temperature in these processes will affect characteristics of color resist materials disposed in the color filter substrate, thereby affecting display effect.

Accordingly, yet another purpose of the present disclosure is to provide a method for fabricating a color filter substrate to solve the following problem: when micro LED units and their driving circuit are made on a color filter substrate, high temperature processes affect characteristics of color resist materials.

Figure 4:
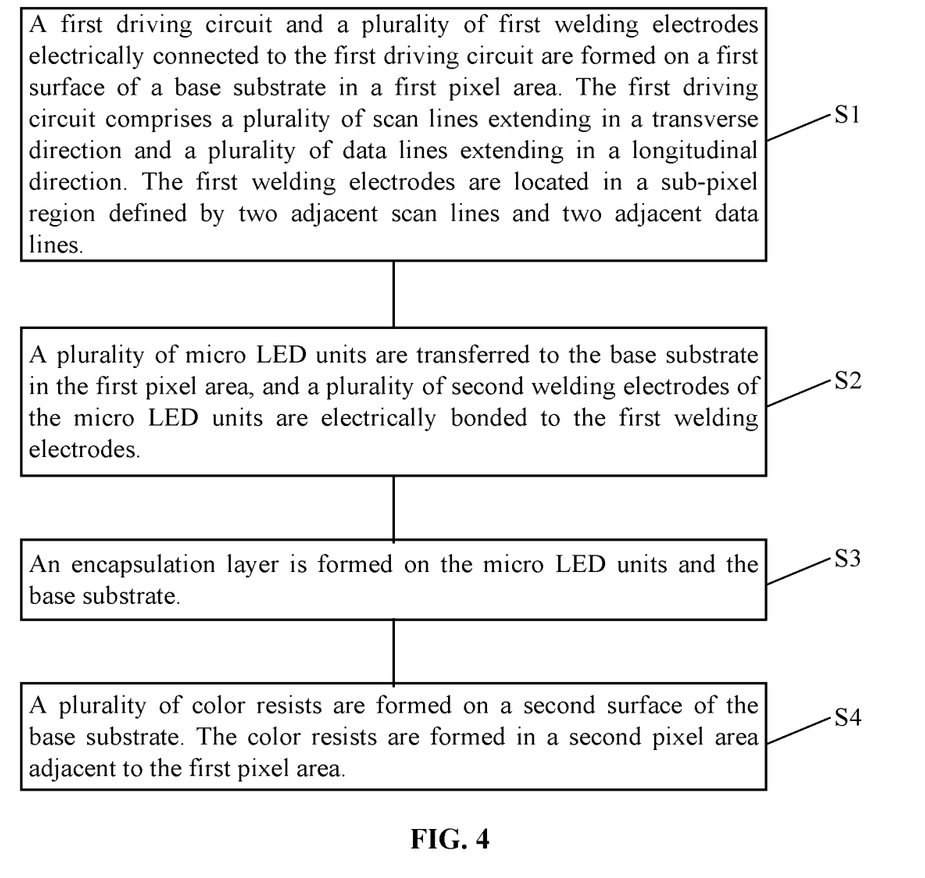
FIG. 4 is a flow chart of a first method for fabricating a color filter substrate according to an embodiment of the present disclosure.

Please refer to FIG. 4, which is a flow chart of a method for fabricating a color filter substrate according to an embodiment of the present disclosure. The method comprises the following steps.

Figure 5A:
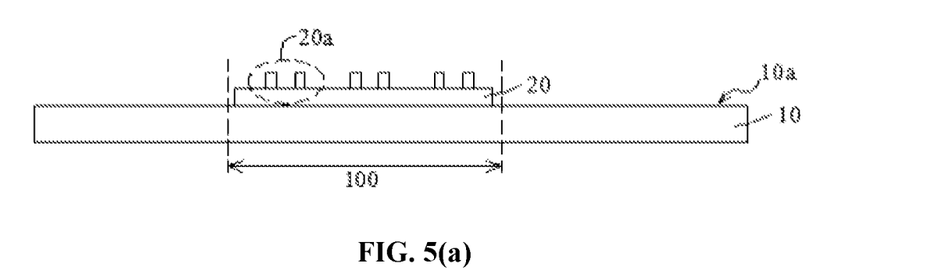
FIG. 5(a) to FIG. 5(d) are schematic flow diagrams of the first method for fabricating the color filter substrate according to an embodiment of the present disclosure.

Step S1: please refer to FIG. 5(a), a first driving circuit 20 and a plurality of first welding electrodes 20a electrically connected to the first driving circuit 20 are formed on a first surface 10a of a base substrate 10 in a first pixel area 100. The first driving circuit 20 comprises a plurality of scan lines extending in a transverse direction and a plurality of data lines extending in a longitudinal direction. The first welding electrodes 20a are located in a sub-pixel region defined by two adjacent scan lines and two adjacent data lines.

Each of the first welding electrodes 20a comprise an N electrode and a P electrode disposed opposite to the N electrode.

Figure 5B:
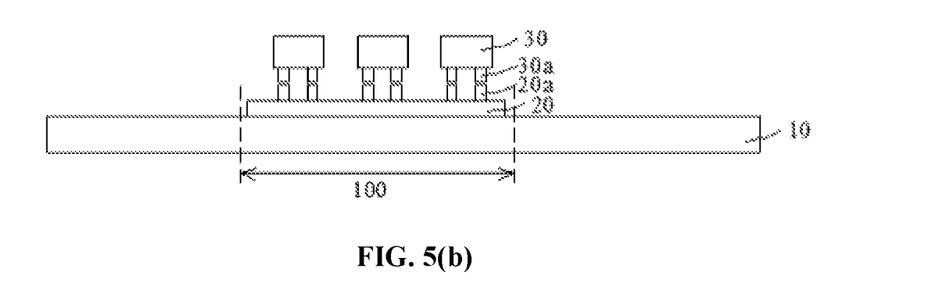

Step S2: please refer to FIG. 5(b), a plurality of micro LED units 30 are transferred to the base substrate 10 in the first pixel area 100, and a plurality of second welding electrodes 30a of the micro LED units 30 are electrically bonded to the first welding electrodes 20a.

Each of the second welding electrodes 30a comprises an N electrode and a P electrode disposed opposite to the N electrode. In a bonding process, the N electrodes of the micro LED units 30 are electrically connected to the N electrodes on the first driving circuit 20, and the P electrodes of the micro LED units 30 are electrically connected to the P electrodes on the first driving circuit 20.

Figure 5C:
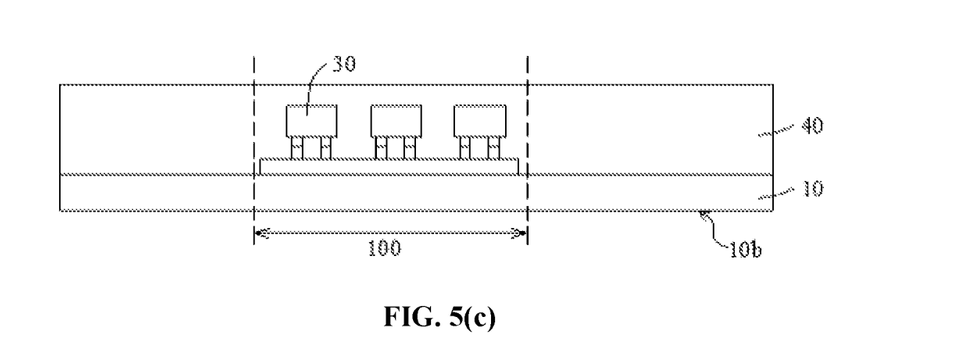

Step S3: please refer to FIG. 5(c), an encapsulation layer 40 is formed on the micro LED units 30 and the base substrate 10.

The encapsulation layer 40 can fill up a level difference between the micro LED units 30 and the base substrate 10. A surface of the encapsulation layer 40 away from the base substrate 10 is formed as a flat surface.

Figure 5D:
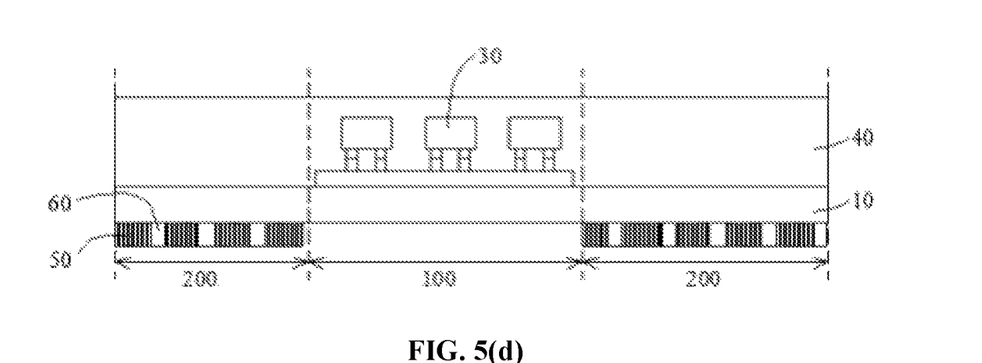

Step S4: please refer to FIG. 5(d), a plurality of color resists 50 are formed on a second surface 10b of the base substrate 10. The color resists 50 are formed in a second pixel area 200 adjacent to the first pixel area 100.

The method further comprises forming a plurality of black matrixes 60 in the second pixel area 200. The black matrixes 60 are located between any two adjacent color resists 50. Sequence of forming the color resists 50 and forming the black matrixes 60 is not limited herein.

In another embodiment, after step S2, the method further comprises the following steps: forming a color conversion film on the micro LED units 30, and removing parts of the color conversion film that do not correspond to the micro LED units 30 to form a plurality of color conversion layers facing the micro LED units 30.

In a color filter substrate of the present disclosure, a first driving circuit is first formed on a base substrate, and micro LED units are bonded, and then color resists and black matrixes are formed. Therefore, it can be ensured that high temperature processes of forming the first driving circuit and bonding the micro LED units do not affect characteristics of color resist materials.

Figure 6:
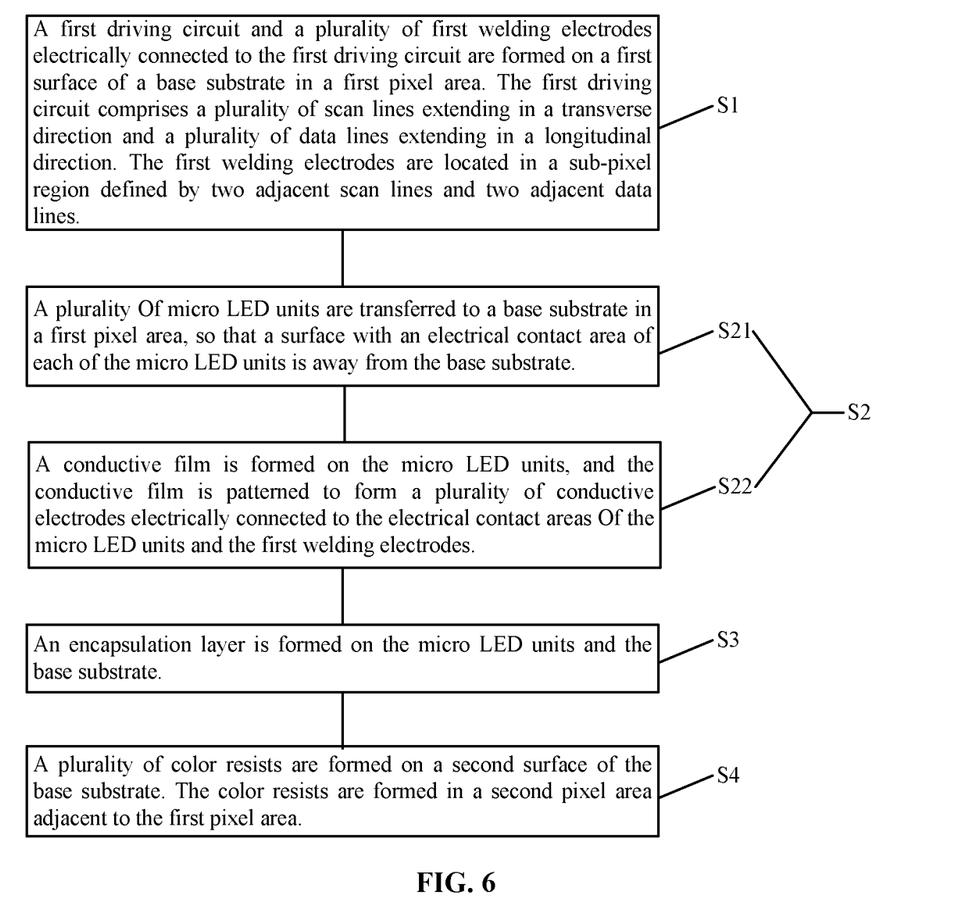
FIG. 6 is a flow chart of a second method for fabricating a color filter substrate according to an embodiment of the present disclosure.

In another embodiment, the present disclosure further provides a method for fabricating a color filter substrate, as shown in FIG. 6. The method differs from the above method for fabricating the color filter substrate only in step S2. In this embodiment, step S2 comprises the following two steps.

Figure 7A:
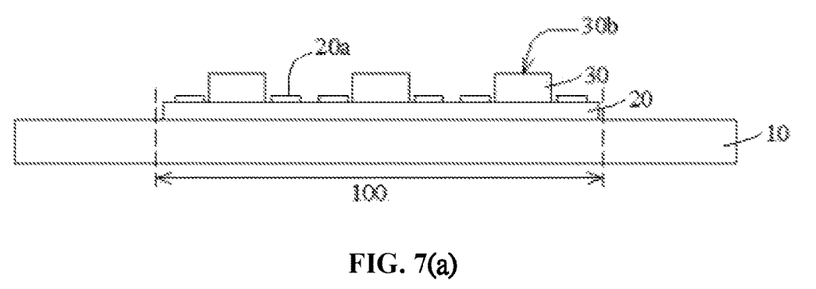
FIG. 7(a) to FIG. 7(b) are schematic flow diagrams of the second method for fabricating the color filter substrate according to an embodiment of the present disclosure.

Step S21: please refer to FIG. 7(a), a plurality of micro LED units 30 are transferred to a base substrate 10 in a first pixel area 100, so that a surface 30b with an electrical contact area of each of the micro LED units 30 is away from the base substrate 10.

Figure 7B:
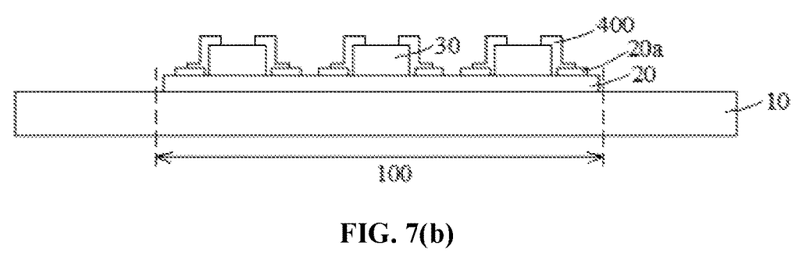

Step S22: please refer to FIG. 7(b), a conductive film is formed on the micro LED units 30, and the conductive film is patterned to form a plurality of conductive electrodes 400 electrically connected to the electrical contact areas of the micro LED units 30 and the first welding electrodes 20a.

Each of the electrical contact areas comprises an N contact area and a P contact area that are disposed oppositely. One of the conductive electrodes 400 electrically connects the N contact area and the N electrode on the first driving circuit 20, and another one of the conductive electrodes 400 electrically connects the P contact area and the P electrode on the first driving circuit 20.

In a color filter substrate of the present disclosure, a first driving circuit is first formed on a base substrate, and micro LED units are bonded, and then color resists and black matrixes are formed. Therefore, it can be ensured that high temperature processes of forming the first driving circuit and bonding the micro LED units do not affect characteristics of color resist materials. In addition, in this embodiment, in a process of bonding the micro LED units, the micro LED units does not need to be provided with traditional welding electrodes. Therefore, a height of the micro LED units after bonding can be reduced.

Figure 8:
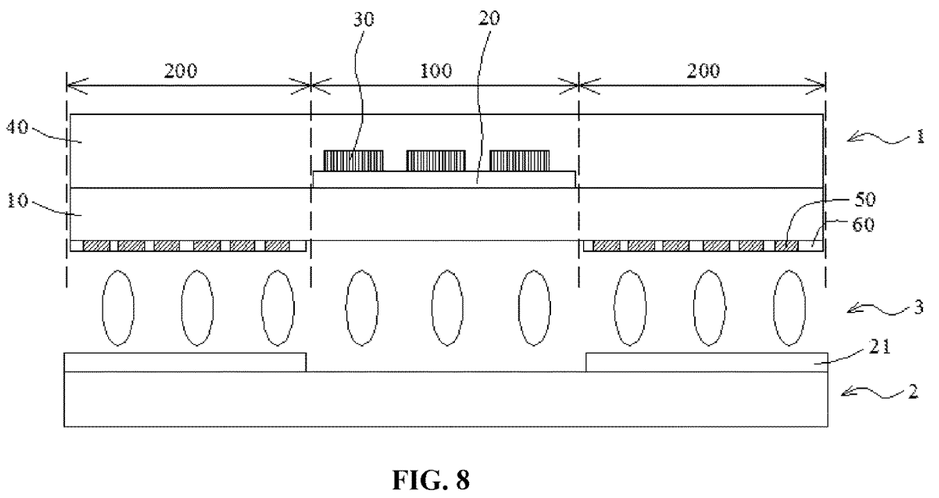
FIG. 8 is a schematic structural diagram of a display panel according to an embodiment of the present disclosure.

The present disclosure further provides a display panel as shown in FIG. 8. The display panel comprises the aforementioned color filter substrate 1, an array substrate 2, and a liquid crystal layer 3 disposed between the color filter substrate 1 and the array substrate 2. The array substrate 2 is provided with a second driving circuit 21. The second driving circuit 21 is disposed in a second display area 200. Because the second driving circuit 21 is not disposed in a first pixel area 100 of the display panel, a light transmittance of the first pixel area 100 will not be affected.

Figure 9:
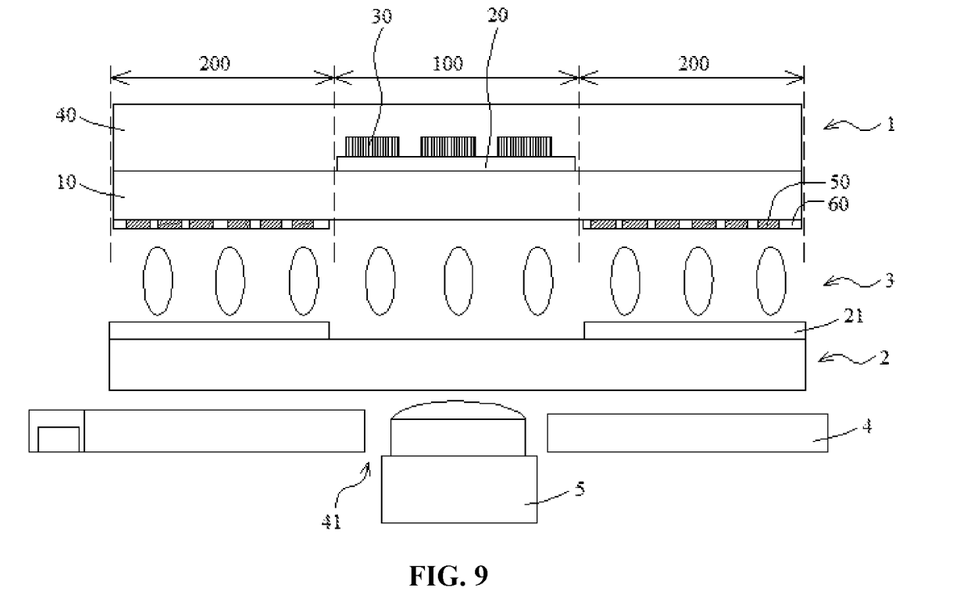
FIG. 9 is a schematic structural diagram of a display device according to an embodiment of the present disclosure.

This present disclosure further provides a display device as shown in FIG. 9. The display device comprises the aforementioned display panel, a backlight module 4, and a sensor assembly 5. The backlight module 4 is provided with a through hole 41 in the first pixel area 100. The sensor assembly 5 is disposed directly in the through hole 41.

The sensor assembly 5 is an optical sensor, which can realize face recognition, distance sensing, fingerprint recognition, and the like, which is not limited thereto.

A color filter substrate and a manufacturing method thereof, a display panel, and a display device provided by the present disclosure achieve ultra-full screen LCD display by combining micro light-emitting diode display technology and liquid crystal display technology. Furthermore, the color filter substrate is provided with a light-transmitting area between any two adjacent micro LED units. The light-transmitting areas can allow light to pass through. Therefore, an in-screen sensor integration solution can be implemented. In the color filter substrate of the present disclosure, a first driving circuit is first formed on a base substrate, and the micro LED units are bonded, and then color resists and black matrixes are formed. Therefore, it can be ensured that high temperature processes of forming the first driving circuit and bonding the micro LED units do not affect characteristics of color resist materials.

The present invention has been described in the above preferred embodiments, but the preferred embodiments are not intended to limit the present invention. Those skilled in the art may make various changes and modifications without departing from the scope of the present invention. The scope of the present invention is determined by claims.

What is claimed is:

1. A color filter substrate, comprising a first pixel area and a second pixel area adjacent to the first pixel area, and further comprising:
   a base substrate;
   a plurality of micro light-emitting diode (LED) units disposed on a first surface of the base substrate in the first pixel area, wherein there are a plurality of light-transmitting areas among the micro LED units; and
   a color resist disposed on a second surface of the base substrate only in the second pixel area, wherein the first surface and the second surface are two opposite surfaces of the base substrate.

2. The color filter substrate according to claim 1, further comprising:
   an encapsulation layer covering the first surface, the micro LED units, and the light-transmitting areas, and the encapsulation layer is located in the first pixel area and the second pixel area.

3. The color filter substrate according to claim 2, wherein a distance between a surface of the encapsulation layer away from the base substrate and the base substrate is greater than a distance between surfaces of the micro LED units away from the base substrate and the base substrate.

4. The color filter substrate according to claim 3, wherein a thickness of parts of the encapsulation layer corresponding to the micro LED units is 2 μm to 80 μm, and a thickness of other parts of the encapsulation layer is 3 μm to 100 μm.

5. The color filter substrate according to claim 2, wherein a light transmittance of the encapsulation layer is greater than or equal to 70%.

6. The color filter substrate according to claim 1, further comprising:
   a first driving circuit disposed on the first surface, and the micro LED units are disposed on and electrically connected to the first driving circuit.

7. The color filter substrate according to claim 6, wherein the first driving circuit comprises a plurality of scan lines extending in a transverse direction and a plurality of data lines extending in a longitudinal direction, two adjacent scan lines and two adjacent data lines define a sub-pixel region, and an area of an orthographic projection of each of the micro LED units on the base substrate is less than an area of an orthographic projection of each of the sub-pixel regions on the base substrate.

8. The color filter substrate according to claim 7, wherein the area of the orthographic projection of each of the micro LED units on the base substrate accounts for 10%-50% of the area of the orthographic projection of each of the sub-pixel regions on the base substrate, and the micro LED units comprise a red light-emitting unit, a green light-emitting unit, and a blue light-emitting unit.

9. The color filter substrate according to claim 1, further comprising:
a flat layer covering the second surface and a surface of the color resist away from the base substrate, and a surface of the flat layer away from the base substrate is a flat surface.

10. A display panel, comprising a color filter substrate, wherein the color filter substrate comprises a first pixel area and a second pixel area adjacent to the first pixel area, and further comprises:
a base substrate;
a plurality of micro light-emitting diode (LED) units disposed on a first surface of the base substrate in the first pixel area, wherein there are a plurality of light-transmitting areas among the micro LED units; and
a color resist disposed on a second surface of the base substrate only in the second pixel area, wherein the first surface and the second surface are two opposite surfaces of the base substrate.

11. A color filter substrate, comprising a first pixel area and a second pixel area adjacent to the first pixel area, and further comprising:
a base substrate;
a plurality of micro light-emitting diode (LED) units disposed on a first surface of the base substrate in the first pixel area, wherein there are a plurality of light-transmitting areas among the micro LED units; and
a color resist disposed on a second surface of the base substrate only in the second pixel area, wherein the first surface and the second surface are two opposite surfaces of the base substrate;
wherein the first pixel area is a micro LED display area, and the second pixel area is a liquid crystal display area.

12. The color filter substrate according to claim 11, further comprising:
an encapsulation layer covering the first surface, the micro LED units, and the light-transmitting areas.

13. The color filter substrate according to claim 12, wherein a distance between a surface of the encapsulation layer away from the base substrate and the base substrate is greater than a distance between surfaces of the micro LED units away from the base substrate and the base substrate.

14. The color filter substrate according to claim 13, wherein a thickness of parts of the encapsulation layer corresponding to the micro LED units is 2 μm to 80 μm, and a thickness of other parts of the encapsulation layer is 3 μm to 100 μm.

15. The color filter substrate according to claim 12, wherein a light transmittance of the encapsulation layer is greater than or equal to 70%.

16. The color filter substrate according to claim 11, further comprising a first driving circuit disposed on the first surface, and the micro LED units are disposed on and electrically connected to the first driving circuit.

17. The color filter substrate according to claim 16, wherein the first driving circuit comprises a plurality of scan lines extending in a transverse direction and a plurality of data lines extending in a longitudinal direction, two adjacent scan lines and two adjacent data lines define a sub-pixel region, and an area of an orthographic projection of each of the micro LED units on the base substrate is less than an area of an orthographic projection of each of the sub-pixel regions on the base substrate.

18. The color filter substrate according to claim 17, wherein the area of the orthographic projection of each of the micro LED units on the base substrate accounts for 10%-50% of the area of the orthographic projection of each of the sub-pixel regions on the base substrate, and the micro LED units comprise a red light-emitting unit, a green light-emitting unit, and a blue light-emitting unit.

19. The color filter substrate according to claim 11, further comprising a flat layer covering the second surface and a surface of the color resist away from the base substrate, and a surface of the flat layer away from the base substrate is a flat surface.

* * * * *